DIGITALIZED SIGNAL GAIN CONTROL CIRCUIT

Filed Nov. 14, 1966 3 Sheets-Sheet 1

INVENTOR.
JOHN J. ANDREA
BY Moody and Phillion
ATTORNEYS

INVENTOR.
JOHN J. ANDREA
BY Moody and Phillion
ATTORNEYS

INVENTOR.
JOHN J. ANDREA
BY Moody and Phillion
ATTORNEYS

United States Patent Office 3,378,786
Patented Apr. 16, 1968

3,378,786
DIGITALIZED SIGNAL GAIN CONTROL CIRCUIT

John J. Andrea, Marion, Iowa, assignor to Collins Radio Company, Cedar Rapids, Iowa, a corporation of Iowa
Filed Nov. 14, 1966, Ser. No. 594,159
5 Claims. (Cl. 330—137)

ABSTRACT OF THE DISCLOSURE

A sample voltage proportional to the output amplitude of an amplifier and reference signals are compared to produce an error signal whose magnitude and polarity indicate the amount and direction of gain change desired. A bidirectional counter responds to the error signal polarity to count forwards or backwards as input clock pulses are supplied thereto from a variable controlled oscillator (VCO). The VCO output frequency varies with the absolute magnitude of the error signal so that for large desired gain changes said output frequency is high to obtain quick gain response, and for low desired gain changes, is low, thus avoiding overshoot and hunting. Suitable load circuit means responds to the count in the counter to produce the desired gain control voltage.

*Specification*

There are many gain control circuits in the prior art, most of which involve a resistive-capacitive type feedback network, having an inherent RC time delay. To avoid such time delay some signal gain control circuits employ digitalized techniques. For example, in one prior art circuit, the magnitude of the count contained in a bidirectional counter determines the magnitude of the gain control voltage. The counter is under the control of an error signal which can be obtained by comparing the input and output signals.

Such error signal, whose magnitude varies as the gain is either decreased or increased, is supplied to the counter which responds to either add or subtract counts caused by pulses supplied thereto from a pulse source.

A suitable load network is connected to the counter output so as to produce an output signal indicative of the count contained therein. For example, the higher the count, the larger the output signal. The type counter employed can be either decimal or binary. A suitable load circuit is responsive to the count in the counter to produce an output voltage representative of the count therein. Such output voltage is fed back to a suitable point in the circuit to change the gain as desired.

One disadvantage of the system described above is that the counter will add or subtract counts at the same rate for a small error voltage as it will for a large error voltage. Thus if the counting rate is high to correct for large error voltage quickly, it will probably be too fast to correct for small error voltages without overshooting and hunting occurring. On the other hand, if the counting rate is made slower to minimize overshooting and hunting, then too much time is required to correct for large error voltages.

It is an object of the present invention to provide a digitalized signal gain control circuit whose rate of correction varies with the amount of error voltage.

A second purpose of the invention is a digitalized gain control circuit employing a bidirectional counter whose contained count is determinative of the gain control voltage and which is responsive to a variable controlled oscillator whose frequency is caused to vary nonlinearily as a function of the magnitude of the error voltage.

A third purpose of the invention is a digitalized gain control circuit whose rate of correction responds faster to large error signals than to error signals of a small magnitude.

A fourth object of the invention is the improvement of signal control voltage circuits, generally.

In accordance with the invention, there is provided a variable controlled oscillator whose output is supplied to a bidirectional counter. There is also provided a voltage comparing means for determining the error voltage which could be, for example, the difference voltage between the input and output signals. Said variable controlled oscillator is responsive to the absolute magnitude of the error voltage to vary its frequency; the rate of change of frequency increasing as a function of an increase in the magnitude of said error voltage. On the other hand, the bidirectional counter is responsive to the polarity of said error signal to count either forwards or backwards, depending on whether the error signal is positive or negative. Thus the bidirectional counter will either add or subtract the pulses from the clock counter at a rate which varies as a function of the magnitude of the error signal. Appropriate circuit means are provided to detect the count in the bidirectional counter and to produce an output voltage which varies as a predetermined function of said count. Such predetermined function in one embodiment of the invention being a linear function.

The said output voltage from the load circuit can vary between arbitrary limits, such as for example, from 0 to +10 volts and can be combined with a constant −10 volts to produce a resultant signal control voltage which varies between 0 and −10 volts.

In accordance with a feature of the invention, the frequency of the variable controlled oscillator is a function of a variable exponential power of the error voltage. More specifically, the relation between the error voltage and the frequency of the variable controlled oscillator can be expressed as follows:

$$f_{vco}=E^x$$

where $x$ is a variable depending on the magnitude of the control voltage E.

Specifically, $x$ might have a value of 2 for relatively high values of error voltage and a value of near unity for low values of error voltage. Thus for large error voltages the recovery rate is caused to be relatively fast, and for small error voltages is caused to be slow, thus avoiding over-shooting and hunting when the error voltage is small.

The above-mentioned and other objects and features of the invention will be more fully understood from the following detailed description thereof when read in conjunction with the drawings in which.

Figure 1:
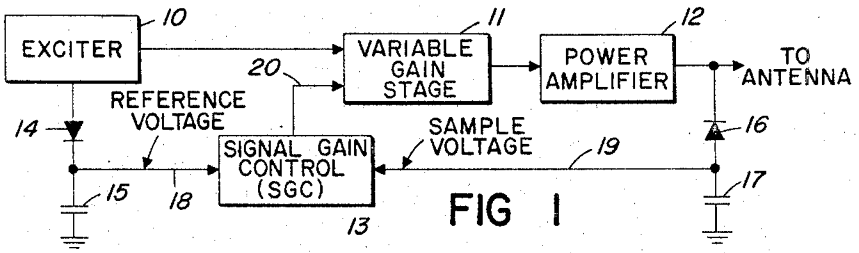
FIG. 1 is a block diagram of an overall system in which the invention can be employed.

Referring now to FIG. 1, a block diagram of a transmitter system is shown employing the signal gain control of the present invention. Exciter 10 supplies its output to variable gain stage 11, which in turn supplies its output to power amplifier 12, from whence the signal is supplied to an antenna, for example. In order to maintain the proper output signal level, the output of power amplifier 12 is supplied through diode 16 to produce a negative charge on capacitor 17. Such negative charge is supplied via the lead 19 to gain control circuit 13, which gain control circuit comprises the present invention.

A second voltage identified as the reference voltage is supplied to another input terminal of gain control circuit via diode 14 and lead 18 and is derived from the output of exciter 10. More specifically, the output of exciter 10 is rectified through diode 14 to accumulate a D-C voltage on capacitor 15, which D-C voltage is supplied as a reference voltage to gain control circuit 13.

Figure 2:
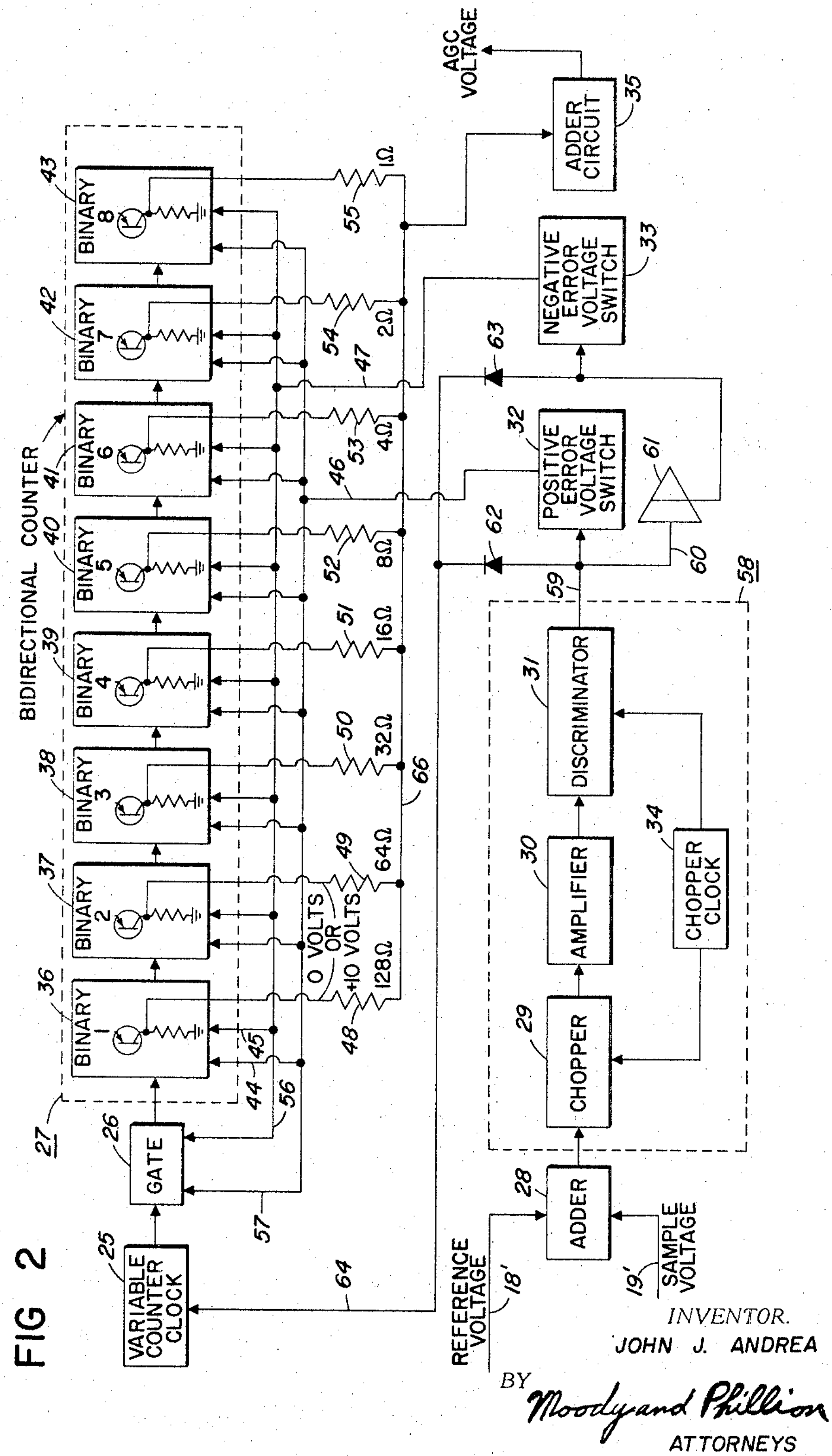
FIG. 2 is a block diagram of the signal gain control circuit which is shown in a single block in FIG. 1.

The gain control circuit 13, shown in detail in FIG. 2, functions to produce an output signal on output lead 20 which controls the gain of variable gain stage 11.

Referring now to FIG. 2, there is shown a detailed block diagram of the gain control circuit 13 of FIG. 1. The sample voltage and the reference voltage are applied to adder 28 via leads 19′ and 18′ which correspond to leads 19 and 18 of FIG. 1. Adder 28 functions to produce the algebraic sum of the reference voltage and sample voltage supplied thereto, which algebraic sum is defined herein as the error voltage and which can be either positive or negative in nature. When the reference voltage and the sample voltage are equal, the error voltage is zero since the reference and sample voltages are of opposite polarity.

The said error voltage is supplied to D-C amplifier 58 which consists of chopper 29, amplifier 30, discriminator 31, and the chopper clock 34, all of which operate in a conventional manner to convert the D-C into A-C, amplify the A-C, and then convert the A-C back into D-C in discriminator 31.

The output of discriminator 31 is a D-C voltage which can be either positive or negative in nature. If such output voltage is positive, the positive error voltage switch 32 is responsive thereto to produce an output signal on its output lead 46 to cause binary counter 27 to count in a first direction defined herein as "adding" counts.

If the output of discriminator 31 is negative, such negative voltage is inverted by inverter 61 and causes negative error voltage switch 33 to respond thereto to produce an output signal on its output terminal 47, thereby causing binary counter 27 to count in a reverse direction, herein defined as "subtracting" counts from the counter.

Reversible binary counters of the type shown as counter 27 in FIG. 2 are known in the prior art, an example being the counter disclosed in an article by R. W. Fenemore, entitled "A Reversible Binary Counter," on pages 204–206 of the May 1955 issue of Electronic Engineering, vol. 27.

It should be noted that when the output of discriminator 31 is positive, inverter 61 will produce a negative output which will not produce a response in negative error voltage switch 33. Similarly, when the output of discriminator 31 is negative, the positive error voltage switch 32 will not respond thereto.

To control the counting rate of variable controlled clock or oscillator 25 there is provided an OR gate consisting of diodes 62 and 63 which supply the absolute value of the output of discriminator 31 to clock 25. The clock 25 is constructed so that its frequency is a function of the magnitude of the error voltage supplied thereto via lead 64. More specifically, as stated above, the frequency of clock 25 preferably is caused to vary as the function of a variable exponential power of the error voltage in the following manner:

$$f_{vco}=E^{x}$$

Such function can be obtained by any one of well-known means, such as a variable impedance, for example a varicap, whose reactance varies as the amount of voltage supplied thereacross. Said variable impedance in turn controls the frequency of the variable controlled oscillator.

Figure 3:
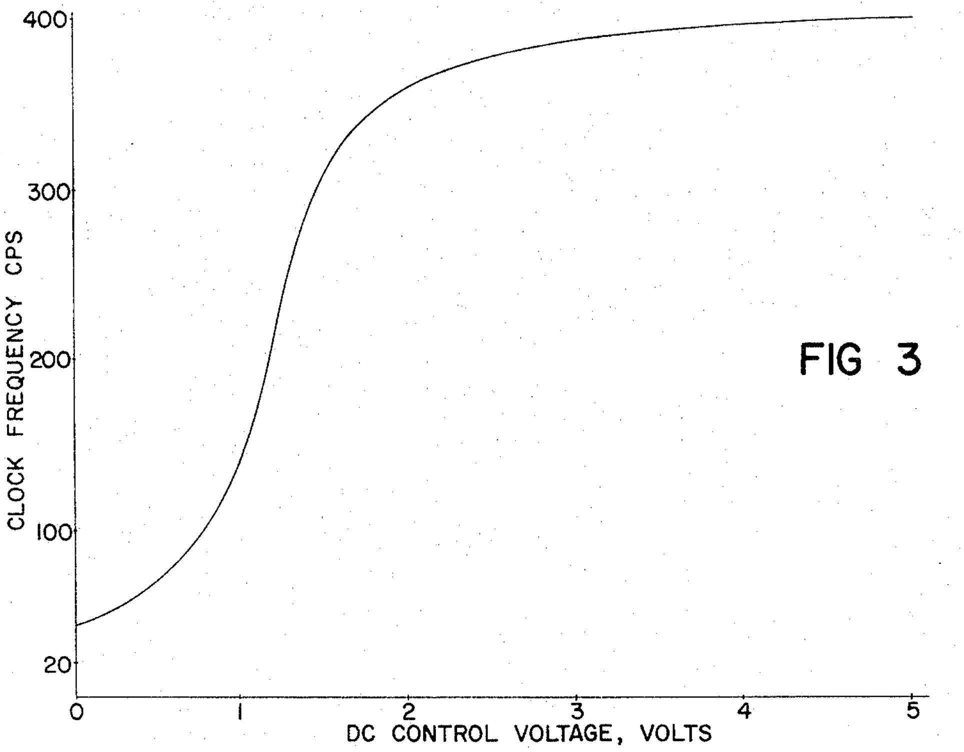
FIG. 3 is a curve showing the relationship between clock frequency and error voltage.

The specific response of frequency vs. the magnitude of the error voltage can vary from application to application. In the present invention a typical frequency response is shown in FIG. 3, wherein the change of clock frequency is greatest between one and two volts and considerably less below one volt. Above two volts the change in frequency does not increase with an increase in error voltage for two reasons; the first being that an error voltage above a certain magnitude in any given application is unlikely and, secondly, the rate of error correction at two volts is sufficiently high.

Returning again to FIG. 2, the output of clock 25 is fed through gate 26 into binary counter 27. The function of gate 26 is generally to prevent clock pulses from entering the binary counter when the error signal is below a minimum threshold value.

More specifically, when the voltage level on input leads 56 or 57 is above a certain minimum threshold value, the gate 26 is opened and permits the flow of pulses from the clock 25 into the binary counter 27. However, to lessen overcontrol and overshot, it is desired that gate 26 be closed when the error voltage is below said minimum threshold value. Consequently, below said minimum threshold value, gate 26 is closed so that no pulses are entered into the binary counter 27.

Associated with each stage of the binary counter is a load resistor such as load resistors 48–55. All of these load resistors are weighted with respect to each other to reflect the magnitude of the count in each stage. For example, consider load resistor 48 which is connected to the output of stage 1, designated as block 36 of binary counter 27. Stage 1 represents the lowest significant binary bit, that is $2^0$, and its load resistor 48 is equal to some value which will be arbitrarily designated as 128 ohms. The resistor 49, associated with the output of the second binary stage 37 therefore has a value of 64 ohms, which is one-half the value of resistor 48.

Similarly, the output resistor 50 of third binary stage 38 has a value of 32 ohms, one-half the value of resistor 49. The remaining load resistors 51, 52, 53, 54, and 55, each have values one-half of the preceding value, e.g., 16 ohms, 8 ohms, 4 ohms, and 1 ohm, respectively.

Assume that the output of each binary stage, i.e., at the collector electrodes of the transistors shown in the stages, is either 0 volt or 10 volts, depending on whether the stage contains a binary "0" or a binary "1." If a binary "1" is present in all eight stages of the counter, then a positive 10 volts wil appear on common bus 66 which connects together all of the second terminals of the load resistors 48 through 55. On the other hand, if any of the binary stages contains a "0," to that extent the +10 voltage output will be diminished towards zero. For example, if stage seven contains a "0" and stages 1, 2, 3, 4, 5, 6, and 8 contain "1's," then the voltage appearing on common bus 66 would be determined by a voltage divider circuit with one leg being equal to the 2 ohm resistor 54 and the other leg being equal to all of the remaining resistors 48, 49, 50, 51, 52, 53, and 55 in parallel, which would be slightly larger than 0.66 ohm. The specific voltage appearing on the bus 66 would then be $$\frac{2}{2+0.66}\times 10 \text{ volts}$$

or approximately 7.5 volts. The foregoing assumes a low source impedance.

The positive voltage appearing on common bus 66 is of the wrong polarity for most, but not all, gain control functions. Consequently, the positive output voltage appearing on output terminal 66 is added to a negative 10 volts in adder circuit 35, so that the signal gain control voltage actually supplied back to the variable gain stage 11 of FIG. 1, ranges from −10 to 0 volts.

In view of the foregoing, it is evident that when the output signal level is too low the binary counter 27 should add counts so that the output voltage on common bus 66 approaches 10 volts. Thus when the positive 10 volts is added to the negative 10 volts in adder 35, the signal gain control voltage is near 0 and will permit a larger output signal from the variable gain stage level 11 of FIG. 1.

It should also be noted that it is possible to eliminate adder 35 by employing a bidirectional counter, the output of which has a range of from 0 volt to a −10 volts, or some other suitable negative voltage. With such a construction, a low output signal from power amplifier 12 should function to reduce the counts contained in the binary counter 27, rather than to add counts, since a reduction in counts will push the signal gain control voltage in a positive direction towards zero, thus causing a larger output from variable gain stage 11 and, consequently, from power amplifier 12.

Figure 4:
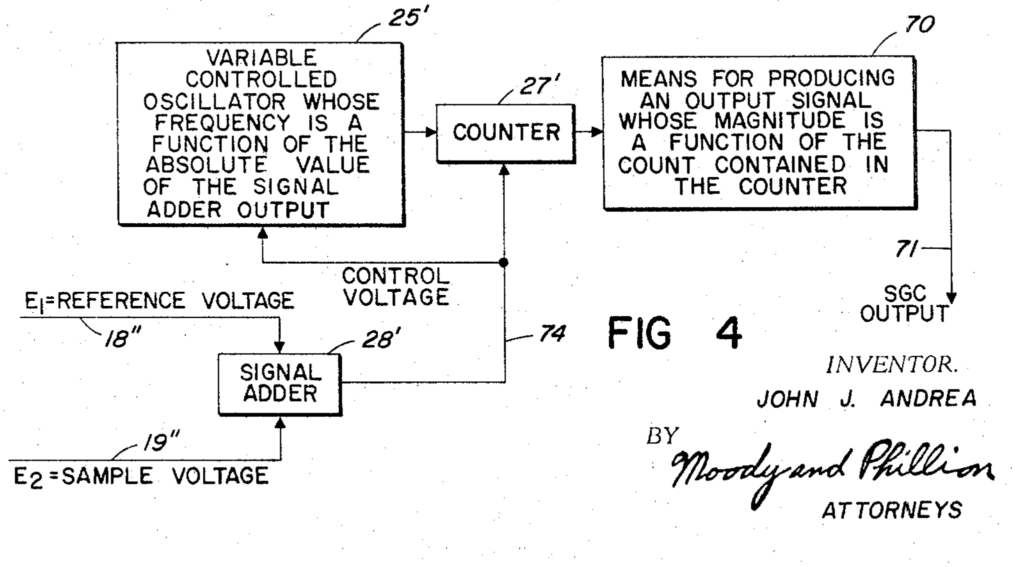
FIG. 4 is a generalized block diagram of the signal gain control circuit.

The general case of the structure of FIG. 2 is shown in FIG. 4, wherein the blocks which have corresponding blocks in FIG. 2, are designated by the same reference character, although primed.

In FIG. 4 the signal adder 28′ functions to compare the reference voltage $E_1$ and the sample voltage $E_2$ to produce an output D-C voltage on output terminal 74 whose polarity reflects the larger magnitudes of voltages $E_1$ and $E_2$. Such error control voltage is supplied to the counter 27′ where the polarity thereof determines the direction of counter 27′, and is also supplied to the variable controlled oscillator 25′, which is constructed to respond to the absolute magnitude of said error control voltage to produce an output signal having a variable frequency.

The block 70 represents a generalized circuit means for detecting the count contained in the counter 27′ to produce a signal gain control output voltage on terminal 71, whose magnitude and amplitude reflect the count contained in counter 27′.

Figure 5:
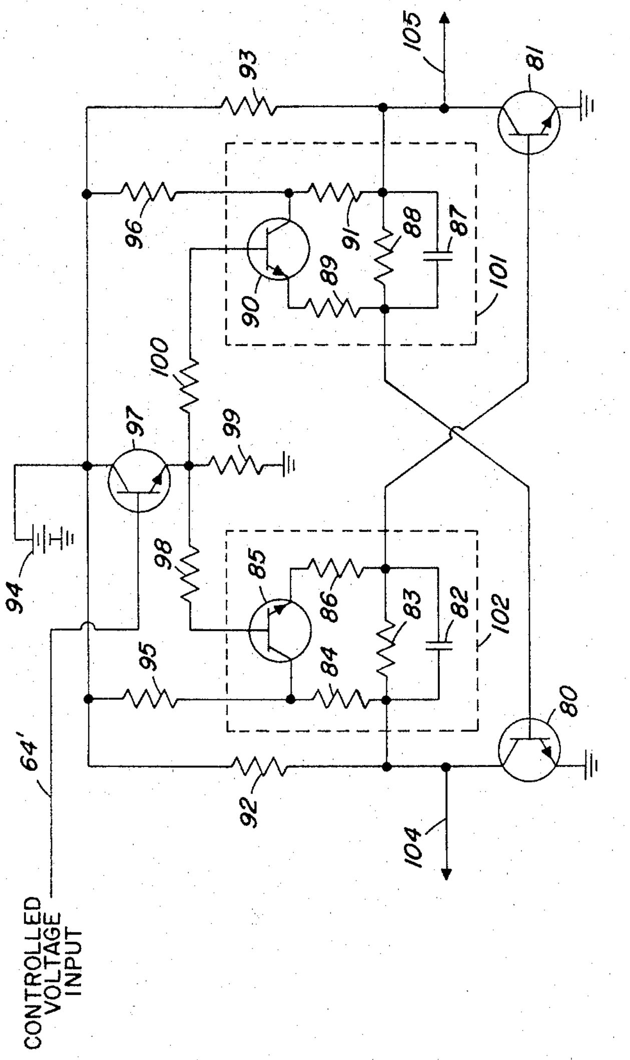
FIG. 5 is a schematic diagram of a variable controlled oscillator which can be employed in the invenion.

Referring now to FIG. 5, there is shown one type of variable controlled oscillator that can be employed as clock source 25 of FIG. 2.

The circuit of FIG. 5 is basically a multivibrator comprising transistors 80 and 81, and cross coupling RC networks connecting the collector of each of transistors 80 and 81 to the emitter of the other transistor. For example, the RC network within dotted block 102 comprised of capacitor 82, resistor 83 and the series combination of resistor 84, transistor 85, and resistor 86 connects the collector electrode of transistor 80 to the base of transistor 81. The transistor 85 functions as a variable resistor to change the RC time constant of the cross coupling circuit and thereby the frequency of the multivibrator. A similar RC cross coupling network 101 connects the collector electrode of transistor 81 to the base electrode of transistor 80.

Transistors 85 and 90 both act as variable resistors to change the RC time constant of the cross coupling networks and are controlled by the emitter current of transistor 97 which produces a voltage across load resistor 99. The transistor 97, in turn, is controlled by the control voltage supplied to the base thereof via lead 64′.

The voltage across load 99 is supplied through resistors 98 and 100 to the bases of transistors 85 and 90, respectively. As the control voltage increases positively, for example, the current through transistor 97 increases, the positive voltage across load resistor 99 increases, and the collector-to-emitter resistances of transistors 85 and 90 decrease, thus decreasing the RC time constant of the cross coupling circuits and increasing the frequency of operation of the multivibrator.

Resistors 84, 86, 89, and 91 function both as load resistors and isolating resistors to prevent an overload of transistors 85 and 90. Resistors 92, 95, 96, and 93 connect voltage source 94 to collector electrodes of the transistors in the circuit. Output signals can be taken off collector taps 104 or 105.

It is to be noted that the function of frequency will depend upon the characteristics of transistors 97, 85, and 90, and upon the values of the components in the cross coupling circuits.

It is to be understood that the forms of the invention shown and described herein are but preferred embodiments thereof and that various changes may be made in circuit arrangement and in type circuits employed without departing from the spirit or the scope thereof.

I claim:

1. A digitalized gain control circuit comprising:

means for producing an error signal whose amplitude and polarity are indicative of the amount and polarity of change of gain required;

variable controlled oscillator means responsive to said error signal to vary its output frequency in accordance with the expression:

$$f_{vco}=f(E)$$

where $f_{vco}$ is the frequency of the output of the variable controlled oscillator, where E is the error signal, and where $f(E)$ increases as E increases in a predetermined manner;

bidirectional counter means responsive to output pulses from said variable controlled oscillator means and to said error signal E to count in a direction determined by the polarity of said error signal.

2. A digitalized gain control circuit comprising:

means for producing an error signal whose amplitude and polarity are indicative of the amount and polarity of change of gain required;

variable controlled oscillator means responsive to said error signal to vary its output frequency in accordance with the expression $$f_{vco}=E^x$$

where $f_{vco}$ is the frequency of the outlet of the variable controlled oscillator, E is the error signal, and $x$ is the variable that increases with E in a predetermined manner;

bidirectional counter means responsive to output pulses from said variable controlled oscillator means and to said error signal E to count in a direction determined by the polarity of said error signal.

3. A digitalized gain control circuit in accordance with claim 2 comprising:

means responsive to the count contained in said bidirectional counter means to produce an output signal whose magnitude and polarity are representative of the count in said bidirectional counter means.

4. A digitalized gain control circuit comprising:

variable controlled oscillator means;

means responsible to a sample signal and to a reference signal for determining an error voltage whose magnitude and polarity are proportional, respectively, to the absolute difference and the relative magnitudes between said sample signal and said reference signal;

bidirectional counter means having a plurality of stages and responsive to the output of said variable controlled oscillator means to count, and further responsive to the polarity of said error voltage for determining the direction of said count;

said variable controlled oscillator means constructed to have its output frequency vary as a function of said error signal;

each stage of said bidirectional counter constructed to selectively produce one of a first and second output voltage, in accordance with the count contained in the stage;

and voltage adding means responsive to the output voltages of the stages of said bidirectional counter means to produce a resultant output signal whose magnitude and polarity are predetermined in accordance with the count contained in said bidirectional counter means.

5. A digitalized gain control circuit in accordance with claim 4 in which:

said variable controlled oscillator means is responsive to said error voltage to vary its repetition rate in accordance with the expression $$f_{vco}=E^x$$

where $f_{vco}$ is the repetition rate of the variable controlled oscillator means, E is the error voltage, and $x$ is a variable that increases with E in a predetermined manner.

References Cited

UNITED STATES PATENTS

| | | | |
|---|---|---|---|
| 3,258,711 | 6/1966 | Searl et al. | 330—137 |
| 3,265,986 | 8/1966 | Wyckoff | 331—18 X |

ROY LAKE, *Primary Examiner.*

S. H. GRIMM, *Assistant Examiner.*

UNITED STATES PATENT OFFICE
CERTIFICATE OF CORRECTION

Patent No. 3,378,786 April 16, 1968

John J. Andrea

It is certified that error appears in the above identified patent and that said Letters Patent are hereby corrected as shown below:

Column 6, line 40, "outlet" should read -- output --.

Signed and sealed this 18th day of November 1969.

(SEAL)
Attest:

Edward M. Fletcher, Jr.
Attesting Officer

WILLIAM E. SCHUYLER, JR.
Commissioner of Patents